United States Patent [19]
Lur et al.

[11] Patent Number: 5,482,882
[45] Date of Patent: Jan. 9, 1996

[54] METHOD FOR FORMING MOST CAPACITOR USING POLYSILICON ISLANDS

[75] Inventors: Water Lur, Taipei; Pin-Iuh Chen, Jong-Lih; Jiunn-Yuan Wu, Guu Keng Shiang, all of Taiwan

[73] Assignee: United Microelectronics Corporation, Hsin-Chu, Taiwan

[21] Appl. No.: 214,592

[22] Filed: Mar. 18, 1994

[51] Int. Cl.⁶ ............................ H01L 27/00; H01L 21/70
[52] U.S. Cl. .................. 437/52; 437/60; 437/919
[58] Field of Search ................ 437/919, 52, 977, 437/60

[56] References Cited

U.S. PATENT DOCUMENTS

| | | | |
|---|---|---|---|
| 4,859,622 | 8/1989 | Eguchi | 437/47 |
| 5,068,199 | 11/1991 | Sandhu | 437/52 |
| 5,110,752 | 5/1992 | Lu | 437/47 |
| 5,134,086 | 7/1992 | Ahn et al. | 437/52 |
| 5,158,905 | 10/1992 | Ahn | 437/52 |
| 5,164,881 | 11/1992 | Ahn | 361/311 |
| 5,182,232 | 1/1993 | Chhabra et al. | 437/200 |
| 5,204,280 | 4/1993 | Dhong et al. | 437/52 |
| 5,213,992 | 5/1993 | Lu | 437/52 |
| 5,227,322 | 7/1993 | Ko et al. | 437/47 |
| 5,244,842 | 9/1993 | Cathey et al. | 437/228 |
| 5,254,503 | 10/1993 | Kenney | 437/228 |
| 5,256,587 | 10/1993 | Jun et al. | 437/52 |
| 5,302,540 | 4/1994 | Ko et al. | 437/47 |
| 5,304,828 | 4/1994 | Kim et al. | 257/309 |
| 5,308,786 | 5/1994 | Lur et al. | 437/67 |
| 5,313,100 | 5/1994 | Ishii et al. | 437/52 |
| 5,332,696 | 6/1994 | Kim et al. | 437/52 |
| 5,342,800 | 8/1994 | Jun et al. | 437/52 |
| 5,350,707 | 9/1994 | Ko et al. | 437/52 |

FOREIGN PATENT DOCUMENTS

| | | |
|---|---|---|
| 3266460 | 3/1990 | Japan. |
| 2308551 | 12/1990 | Japan. |

OTHER PUBLICATIONS

Wolf et al., *Silicon Processing For the VLSI Era*, vol. I, Lattice Press 1986, pp. 400–401, 581.

Jun et al., *The Fabrication and Electrical Properties of Modulated Stacked Capacitor for Advanced DRAM Applications*, IEEE (1992).

IBM Technical Disclosure, *Method of Increasing Capacitance Area Using RIE Selectivity*, vol. 35, No. 7 (Dec. 1992).

*Primary Examiner*—Olik Chaudhuri
*Assistant Examiner*—H. Jey Tsai
*Attorney, Agent, or Firm*—Meltzer, Lippe Goldstein et al.

[57] ABSTRACT

A MOST capacitor for use in a DRAM cell by using non-uniform silicide formations on polysilicon to define a plurality of polysilicon pillars. Unreacted polysilicon islands are used as a mask to selectively form the pillars in the polysilicon electrode layer.

14 Claims, 3 Drawing Sheets

METHOD FOR FORMING MOST CAPACITOR USING POLYSILICON ISLANDS

FIELD OF THE INVENTION

The present invention relates to a technique for forming a modulated stacked capacitor for use in a Dynamic Random Access Memory (DRAM) cell.

BACKGROUND OF THE INVENTION

A DRAM cell typically comprises a MOS transistor and a capacitor. An example of such a DRAM cell is shown in FIG. 1. The DRAM cell 10 of FIG. 1 comprises the MOSFET 12 and the capacitor 14. A word line is connected to the gate of the MOSFET 14. A bit line is connected to the source of the MOSFET 12. The capacitor 14 is connected to the drain of the MOSFET 12. The state of the DRAM cell 10 is determined by whether or not the capacitor 14 is holding a charge.

The DRAM cell is read by using the bit line to determine whether or not a charge is stored in the capacitor. The DRAM cell is written by using the bit line to add or remove charge from the capacitor. However, the cell can only be read or written when the cell is addressed (i.e. activated) by the word line.

With the continuous advancement of DRAM technology, the chip area used for one DRAM cell is getting smaller. There are two methods used to increase the capacitance of the capacitor in the DRAM cell. One method is to decrease the effective dielectric thickness and the other method is to increase the effective capacitor surface area.

It is expected that future scaled DRAM cells will rely heavily on the quality and storage capacity of ultra thin dielectric materials that are sandwiched between two heavily doped polysilicon and/or silicon electrodes. However, higher capacitance values cannot be obtained without seriously degrading the device retention time. Specifically, films thinner than 50 angstroms present excessive leakage current due to direct carrier tunneling. For a given capacitor dielectric film, the larger the surface area, the larger the capacitance.

FIGS. 2, 3, 4, 5 and 6 illustrate prior art DRAM cells. The DRAM cell 20 of FIG. 2 comprises a MOSFET 22 and a capacitor 24 which are both formed on a silicon substrate 25. The MOSFET 22 comprises the source and drain regions 26 and 28, which regions are separated by the channel 29. It should be noted that the source and drain regions 26, 28 have a conductivity type opposite to that of the substrate. A metal contact 27 directly contacts the source region 26. A gate 30 is formed from polysilicon material (Poly-1) and is separated from the surface of the substrate by an oxide layer 31. An additional oxide region 32 is on top of the gate 30.

The capacitor 24 sits on top of the drain region 28. The capacitor 24 has a first electrode 40 formed by a conducting polysilicon material (poly-2), a thin dielectric layer 42 which may be NO or ONO, and a second electrode 44 which is formed from a conducting polysilicon material (poly-3). The capacitor contacts the drain region 28 in a space between the oxide region 32 and the oxide region 52.

FIG. 3 shows a DRAM cell 20' which is similar to the DRAM cell 20 of FIG. 2. The main difference is that the shape of the poly-2 electrode layer 40, dielectric layer 42 and poly-3 electrode layer 44 have been altered to increase the surface area of the capacitor 24.

FIG. 4 shows a DRAM cell 20" in which the poly-2 electrode 40 has been made rugged to increase the surface area of the capacitor.

FIG. 5 shows a DRAM cell 20''' in which the polysilicon electrode 40 is formed from a plurality of horizontal layers 41 to increase the surface area of the capacitor.

Another capacitor structure which can be used to increase the capacitance of a DRAM cell is known as MOST (modulated stacked) capacitor. (See e.g. Y. K. Jun et al, "The Fabrication and Electrical Properties of Modulated Stacked Capacitor for Advance DRAM Applications" IEEE Electron Device Letters, Vol. 13, No. 8, August 1992, the contexts of which are incorporated herein by reference).

A DRAM cell 20'''' having a MOST capacitor structure is illustrated in FIG. 6. In the capacitor 24 of FIG. 6, the poly-2 electrode 40 comprises a plurality of spaced apart vertical pillars 43. The capacitor dielectric 42 and poly-3 electrode 44 are then deposited over the spaced apart vertical pillars 43. In this manner a capacitor with a large effective surface area is formed in a DRAM cell.

It is an object of the present invention to provide a technique for manufacture of a MOST capacitor for use in a DRAM cell.

SUMMARY OF THE INVENTION

A technique for making a MOST capacitor for use in a DRAM cell utilizes polysilicon islands after non-uniform silicide formation. The polysilicon islands are used as a mask to selectively form deep grooves in a polysilicon electrode of the capacitor.

DETAILED DESCRIPTION OF THE INVENTION

Figure 1:
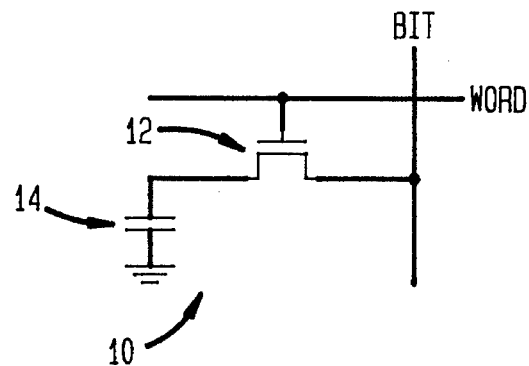
FIG. 1 schematically illustrates DRAM cell.
Figure 2:
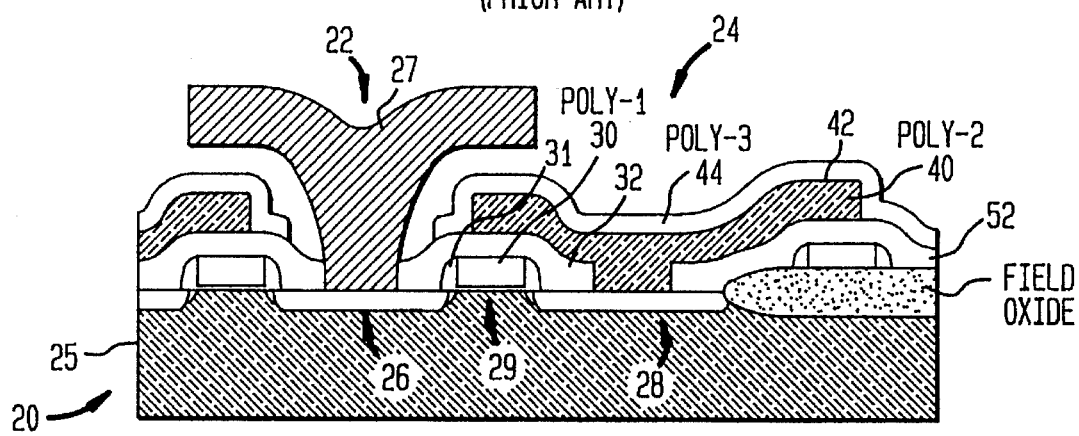
FIGS. 2–6 illustrate various prior art capacitors utilized in DRAM cells.
Figure 3:
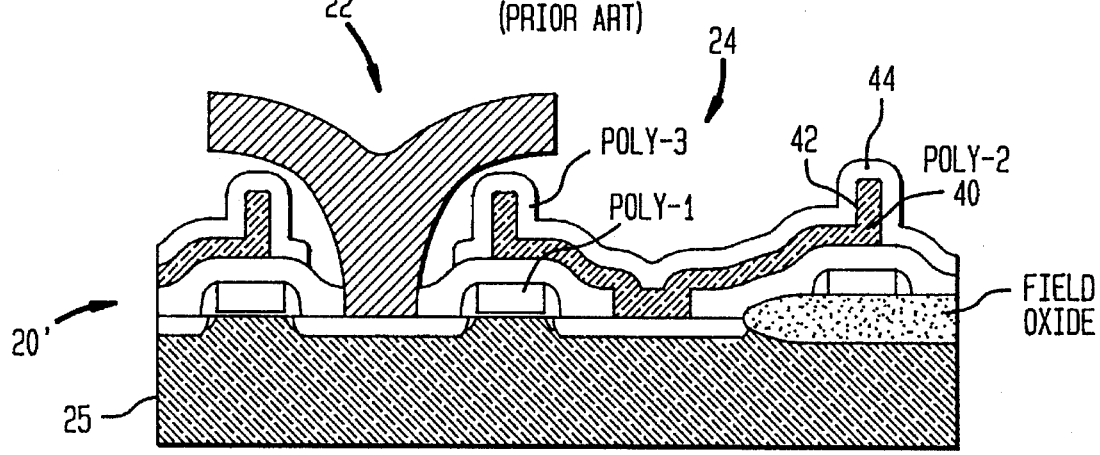
Figure 4:
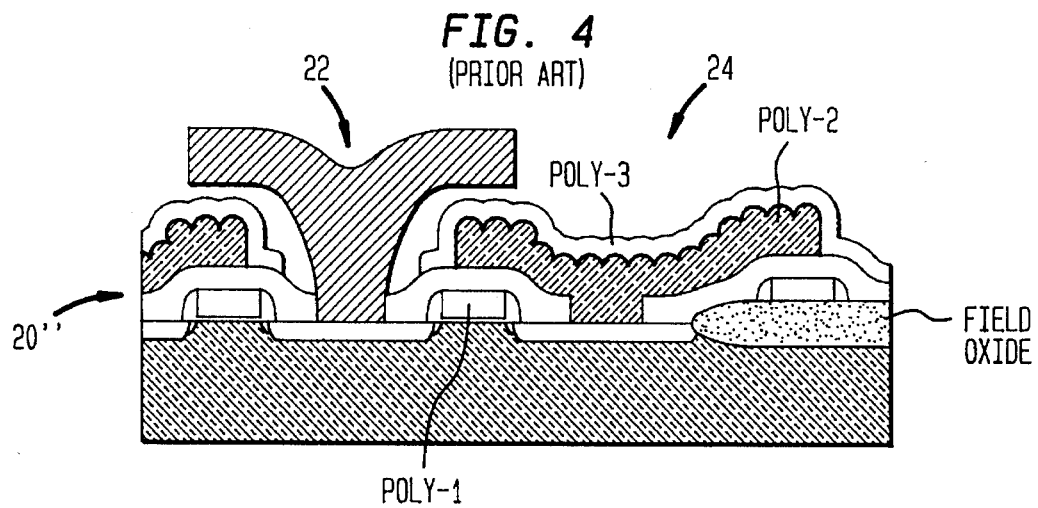
Figure 5:
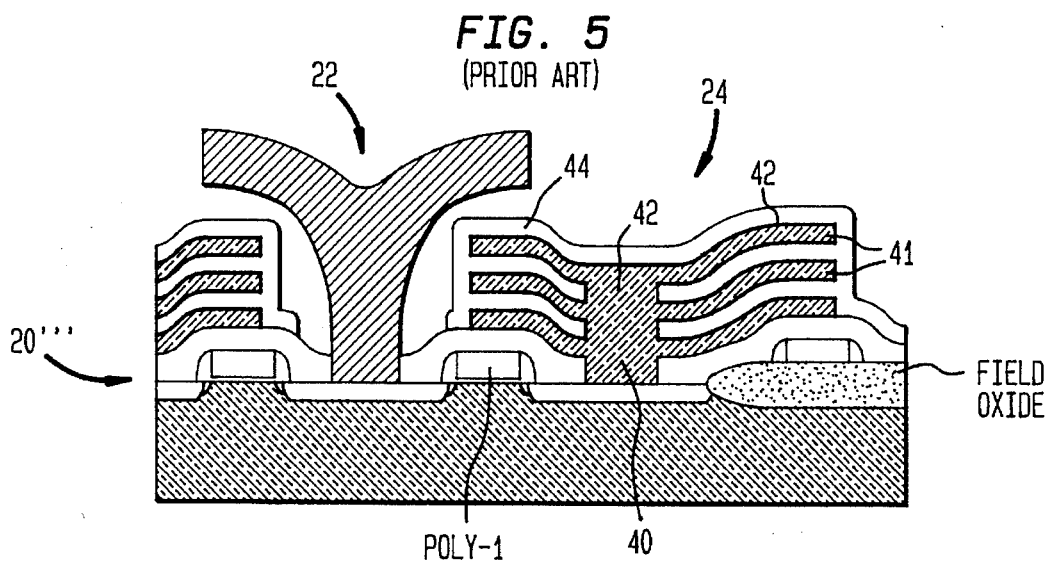
Figure 6:
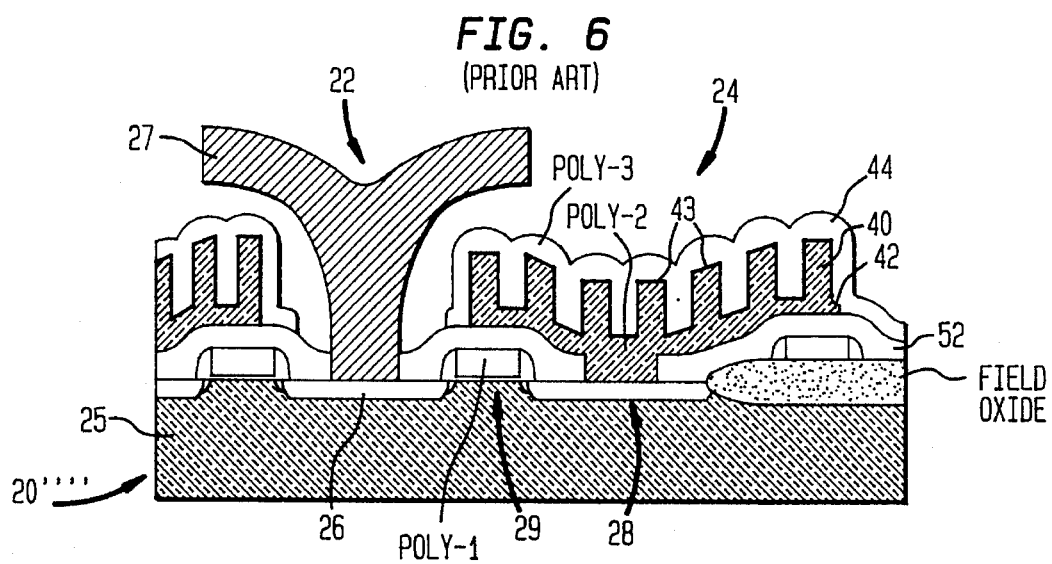

A MOST capacitor in accordance with the present invention is formed as follows.

1. A polysilicon electrode layer 40 with a thickness between 5,000 and 10,000 Angstroms is formed on a drain region 28 of a substrate 25 (see FIGS. 2–6) and over the oxide regions 32 and 52. The polysilicon electrode layer 40 is deposited by chemical vapor deposition or the like after the formation of poly-contacts.

2. The polysilicon electrode layer 40 is doped with $POCl_3$ or ion implanted with arsenic or phosphorous, or the like.

3. A thin insulating layer 110 (e.g. $SiO_2$ or $Si_3N_4$) is deposited on the layer 40 with a thickness of 500–2,000 Angstroms.

4. A polysilicon layer 112 is deposited on the insulating layer 110 to a thickness of 2,000–6,000 Angstroms at a temperature between 580°–650° C.

5. A thin transition metal layer 114 such as titanium, cobalt, nickel, or tungsten, is deposited on the polysilicon layer 112 to a thickness of less than half of the polysilicon layer 112, (e.g. 800–2,000 Angstroms).

Figure 7A:
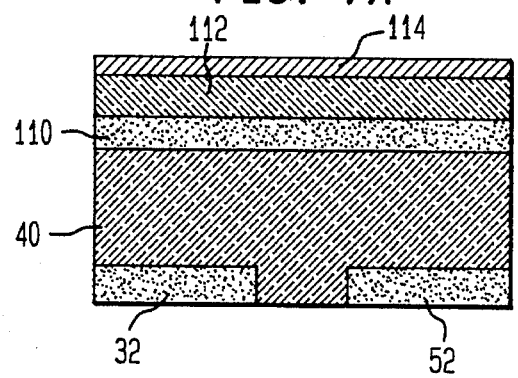
FIGS. 7(a), 7(b), 7(c), and 7(d) illustrate a technique for forming a MOST capacitor for use in a DRAM cell in accordance with the present invention.
Figure 7B:
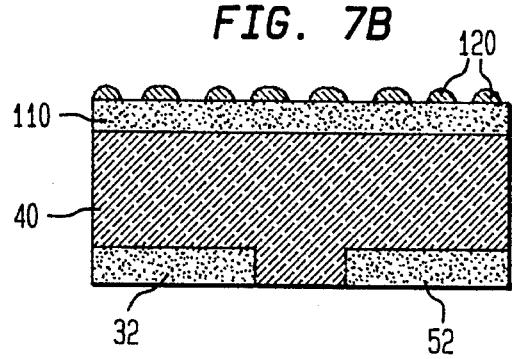

6. The structure is then thermally treated at a temperature of between 600° C.–900° C. for a time period of 10 seconds to 30 minutes to form silicide at the interface between the polysilicon layer 112 and the transition metal layer 114. Because of the non-uniform orientation of the polysilicon grains in the polysilicon layer 112, and the presence of interface oxide, the resulting silicide is of non-uniform thickness and a plurality of unreacted polysilicon islands remain. The reacted silicide is easily stripped by dipping the structure in HF content solution. Unreacted polysilicon islands 120 with a size between 0.02 and 0.2 microns are left on the underlying insulating layer 110 shown in FIG. 7(b).

Figure 7C:
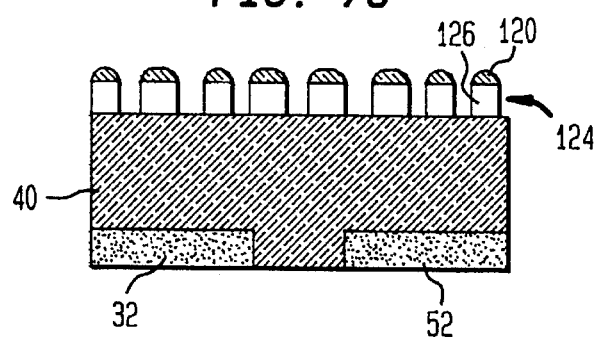

7. Using the unreacted polysilicon islands as a mask, the underlying insulating layers 110 is etched (e.g. using reactive ion etching) to form a plurality of two-level islands 124 as shown in FIG. 7(c). Each two-level island 124 comprises an unreacted polysilicon island 120 on top of an insulating island 126. The islands 124 have a diameter size of 0.02–0.2 microns.

Figure 7D:
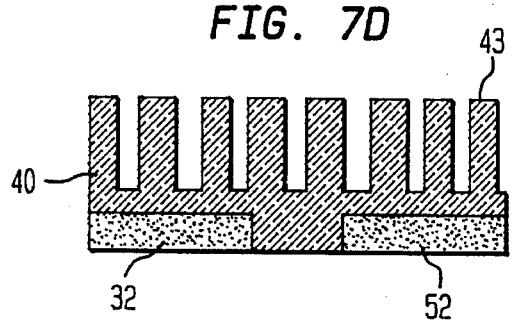

8. The polysilicon electrode layer 40 is then etched to a depth of 4,000–8,000 Angstroms using the islands 124 as a mask. The two-level mask islands 124 are then stripped away with HF content solution or hot $H_3PO_4$ solution. The resulting silicon pillars 43 are shown in FIG. 7(d).

9. A capacitor dielectric layer 42 (see FIG. 6) is then deposited on top of the polysilicon electrode layer 40. The dielectric layer may be ON or ONO and deposited using CVD, PVD, or thermal treatments.

10. The polysilicon electrode layer 40 and the dielectric layer 42 are then etched to isolate the capacitor.

11. A second polysilicon electrode layer 44 (see FIG. 6) is then deposited on top of the dielectric layer 42, doped to become conductive, and etched to complete the capacitor.

12. Another dielectric layer, (not shown), typically borophosphosilicate glass or the like is deposited and etched to form openings for the metal contacts (e.g. the contact 27) which are then deposited.

It should be noted that the capacitance of the stacked capacitor produced in accordance with the invention can be controlled by the density of the unreacted polysilicon islands 120 and the thickness of the polysilicon layer 112. Typically, for each DRAM cell the capacitance of the stacked capacitor should be 30 pF or larger.

Finally, the above described embodiments of the invention are intended to be illustrative only. Numerous alternative embodiments may be devised by those skilled in the art without departing from the spirit and scope of the following claims.

We claim:

1. A method for making a capacitor for use in a DRAM cell, comprising the steps of:
   (a) forming a conductive polysilicon electrode layer on a silicon substrate;
   (b) forming an insulating layer on the conductive polysilicon electrode layer;
   (c) forming a second polysilicon layer on the insulating layer;
   (d) forming a transition metal layer on the second polysilicon layer;
   (e) applying a thermal treatment to form a silicide having unreacted polysilicon islands at the interface of the transition metal and insulating layers;
   (f) removing the silicide, thereby leaving said unreacted polysilicon islands on the surface of said insulating layer;
   (g) using the unreacted polysilicon islands as a mask, etching the insulating layer to form two-level islands, each island comprising a polysilicon island on top of an island of insulating material and
   (h) using the two-level islands as a mask, etching said conductive polysilicon electrode layer to form pillars therein.

2. The method of claim 1, further comprising the steps of:
   (a) depositing a dielectric layer on said conductive polysilicon electrode layer; and
   (b) depositing a third polysilicon electrode layer on said dielectric layer.

3. The method claim 1 wherein said transition metal layer is formed from a metal from the group consisting of titanium, cobalt, nickel and tungsten.

4. The method of claim 1 wherein said insulating layer is formed from a material from the group consisting of $SiO_2$ and $Si_3N_4$.

5. A method for making a capacitor for use in a DRAM cell, comprising the steps of:
   (a) forming a conductive polysilicon electrode layer on a silicon substrate;
   (b) forming an insulating layer on the conductive polysilicon electrode layer;
   (c) forming a second polysilicon layer on the insulating layer;
   (d) forming a transition metal layer on the second polysilicon layer using one of cobalt, tungsten, titanium, and nickel;
   (e) applying a thermal treatment to form a silicide having unreacted polysilicon islands at the interface of the metal and insulating layers;
   (f) removing the silicide, thereby leaving said unreacted polysilicon islands on the surface of said insulating layer;
   (g) using the unreacted polysilicon islands as a mask, etching the insulating layer to form two-level islands, each island comprising a polysilicon island on top of an island of insulating material and
   (h) using the two-level islands as a mask, etching said conductive polysilicon electrode layer to form pillars therein.

6. The method of claim 5, further comprising the steps of:
   (a) depositing a dielectric layer on said conductive polysilicon electrode layer; and
   (b) depositing a third polysilicon electrode layer on said dielectric layer.

7. The method according to claim 5, wherein the step of forming a conductive polysilicon electrode layer comprises depositing polysilicon by chemical vapor deposition.

8. The method according to claim 7, wherein the step of forming a conductive polysilicon electrode layer further comprises the step of doping the deposited polysilicon with $POCl_3$.

9. The method according to claim 7, wherein the step of forming a conductive polysilicon electrode layer further comprises the step of ion implanting the deposited polysilicon with one of arsenic and phosphorous.

10. The method according to claim 5, wherein the step of forming a second polysilicon layer comprises depositing polysilicon at a temperature between 580° C.–650° C.

11. The method according to claim 5, wherein the step of applying a thermal treatment comprises thermally treating at a temperature between 600° C.–900° C. for a time period between 10 seconds to 30 minutes.

12. The method according to claim 5, wherein the step of removing the silicide comprises stripping the silicide by dipping in an HF content solution.

13. The method according to claim 5, wherein the step of etching the insulating layer comprises using reactive ion etching.

14. The method according to claim 5, wherein after the step of using the two-level islands as a mask, stripping away the two-level islands using one of an HF content solution and a hot $H_3PO_4$ solution.

* * * * *